(12) United States Patent
Wang et al.

(10) Patent No.: US 7,876,159 B2
(45) Date of Patent: Jan. 25, 2011

(54) POWER AMPLIFIER CIRCUIT FOR MULTI-FREQUENCIES AND MULTI-MODES AND METHOD FOR OPERATING THE SAME

(75) Inventors: Shih-Ming Wang, Taipei County (TW);
Cheng-Chung Chen, Hsinchu (TW);
Yu-Cheng Hsu, Taipei County (TW);
Chung-Chi Lai, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/023,002

(22) Filed: Jan. 30, 2008

(65) Prior Publication Data
US 2009/0045877 A1 Feb. 19, 2009

(30) Foreign Application Priority Data
Aug. 16, 2007 (TW) .............................. 96130330 A

(51) Int. Cl.
*H03F 3/68* (2006.01)
(52) U.S. Cl. ................................... 330/295; 330/124 R
(58) Field of Classification Search .................. 330/295, 330/51, 124 R
See application file for complete search history.

(56) References Cited

U.S. PATENT DOCUMENTS

| 6,137,355 A | 10/2000 | Sevic et al. | |
|---|---|---|---|
| 7,369,822 B2 * | 5/2008 | Loraine et al. | ........... 455/127.3 |
| 2002/0135425 A1 * | 9/2002 | Kim et al. | .................. 330/295 |

* cited by examiner

*Primary Examiner*—Robert Pascal
*Assistant Examiner*—Khiem D Nguyen
(74) *Attorney, Agent, or Firm*—Jianq Chyun IP Office

(57) ABSTRACT

A multi-frequency and multi-mode power amplifier is provided. The amplifier has a carrier power amplifier and a peaking power amplifier. The carrier power amplifier receives a first signal and outputs a first amplified signal, in which a first transistor size adjusting unit is included to adjust an equivalent transistor size based on a mode indication signal. The peaking power amplifier receives a second signal and outputs a second amplified signal, in which a second transistor size adjusting unit is included to adjust an equivalent transistor size based on the mode indication signal.

16 Claims, 9 Drawing Sheets

POWER AMPLIFIER CIRCUIT FOR MULTI-FREQUENCIES AND MULTI-MODES AND METHOD FOR OPERATING THE SAME

CROSS-REFERENCE TO RELATED APPLICATION

This application claims the priority benefit of Taiwan application serial no. 96130330, filed on Aug. 16, 2007. The entirety of the above-mentioned patent application is hereby incorporated by reference herein and made a part of this specification.

BACKGROUND OF THE INVENTION

The present invention relates to a power amplifier circuit and operation method thereof. More specifically, the present invention relates to a multi-frequency and multi-mode power amplifier circuit and operation method thereof.

As people are anxious for the transmission volume of wireless communication system, high level digital modulating method starts to be widely used. The congenital modulating nature of the digital modulation requires that the power amplifier has higher peak-to-average output power ratio. In the case of general system and environment, in most of the time the traditional power amplifier operates at an average output power region with low efficiency, and larger peak-to-average output power ratio means the power amplifier will face even lower operation efficiency. This means the power amplifier becomes an element of low operation efficiency as digital modulating method becomes high level.

Unfortunately, the high power consumption nature of power amplifier usually consumes $1/3$-$1/2$ electricity of the entire communication equipment. Therefore for cell phones and the alike terminal equipments, low operation efficiency shortens standby and communication time. For base stations and the alike central office equipments, besides the increase on the electricity bill of telecommunication business owns, the costs spending on cooling and large power equipments increase as well. Therefore, keeping the power amplifier maintaining a certain high efficiency in all average-to-peak output power region has been a demand of new generation power amplifier.

Doherty power amplifier, which is one of the solutions for such demand, has been a hot research subject either in research papers or in patent field in recent years. Besides the congenital high efficiency, which is needed as described above, this amplifier has been proved by many research results on circuit linearization and minimization. Under the trend towards multi-frequency and multi-mode mobile communications, power amplifiers not only advance towards multi-frequency, and also needs to have adjustable average-to-peak output power point to meet the multi-mode operation needs. However, the Doherty amplifiers commonly available on the market mostly are of single-frequency and single-mode operation, the future of which is more and more facing challenge. Although a few patents, such as the United States Patent U.S. Pat. No. 6,137,355 provided single-frequency and dual-mode operation, the patent mentioned to adjust the effective size and operation class (for example, A, AB and B classes in transistor operation) of active element through bias, so that the power amplifier is switched between high linearity mode and high efficiency mode. However, there is no the feature of adjustable average-to-peak output power point because of no external circuits that Doherty power amplifier needed. Moreover, more groups of bias control circuits are required; and therefore the design complexity is increased and is only limited to single-frequency operation in frequency aspect.

SUMMERY OF THE INVENTION

The present invention provides a multi-frequency and multi-mode power amplifier. With multi-frequency matching network and adjustable size of active components, the required average-to-peak output power point can be adjusted according to communications system of different frequencies.

Therefore, the present invention provides a multi-frequency and multi-mode power amplifying circuit, comprising an input-signal processing unit, a carrier power amplifier, a peaking power amplifier and an output-signal processing unit. The input-signal processing unit is used to receive a radio frequency (RF) signal and to output a first signal and a second signal. An input end of the carrier power amplifier is coupled to the input signal processing unit and receives the first signal to generate a first amplified signal. The carrier amplifier further comprises a first transistor size adjusting unit that adjusts an equivalent transistor size according to a mode indication signal. An input end of the peaking power amplifier is coupled to the input-signal processing unit and receives the second signal to generate a second amplified signal. The peaking power amplifier further comprises a second transistor size adjusting unit that adjusts an equivalent transistor size according to the mode indication signal. The output-signal processing unit receives the first and the second amplified signals, and combines the first and the second amplified signals, and then passes the same through the matching network to output an output signal.

In addition, the present invention further provides a multi-frequency and multi-mode power amplifier, comprising a carrier power amplifier and a peaking power amplifier. The input end of the carrier power amplifier receives a first signal to generate a first amplified signal. The carrier power amplifier further comprises a first transistor size adjusting unit that adjusts an equivalent transistor size according to a mode indication signal. The input end of the peaking power amplifier receives a second signal to generate a second amplified signal. The peaking power amplifier further comprises a second transistor size adjusting unit that adjusts an equivalent transistor size according to the mode indication signal.

The present invention further provides an operation method of the multi-frequency and multi-mode power amplifier. First, a mode indication signal is received to generate a first and a second bias signals and a first and a second switch control signals. The efficiency and the linearity of the carrier power amplifier are adjusted according to the first bias signal. The equivalent transistor size of the carrier power amplifier is controlled according to the first switch control signal. Similarly, the efficiency and the linearity of the peaking power amplifier are adjusted according to the second bias signal. The equivalent transistor size of the peaking power amplifier is controlled according to the second switch control signal.

In order to the make the aforementioned and other objects, features and advantages of the present invention comprehensible, some embodiments accompanied with figures are described in detail below.

BRIEF DESCRIPTIONS OF DRAWINGS

FIG. 1 schematically illustrates a circuit structure diagram of a power amplifier of the present embodiment.

FIG. 2A to FIG. 2D schematically illustrate a plurality of circuit examples of impedance transformer.

FIG. 3A schematically illustrates a structure diagram of an embodiment of the power distributor.

FIGS. 3B and 3C schematically illustrates an internal structure diagram of a transmission unit in the power distributor.

FIGS. 4A and 4B are embodiments of the dual-frequency matching network of the present embodiment.

FIG. 5A schematically illustrates a circuit structure diagram of the carrier power amplifier of the present embodiment.

FIG. 5B schematically illustrates a circuit structure diagram of the peaking power amplifier of the present embodiment.

FIG. 5C schematically illustrates a circuit structure diagram of a power amplifier under multi-mode configuration of the present embodiment.

DESCRIPTION OF EMBODIMENTS

The multi-frequency and multi-mode power amplifying circuit of the present embodiment at least comprises an input signal processing unit, a carrier power amplifier, a peaking power amplifier and an output signal processing unit. For example, the above two power amplifiers form a Doherty power amplifier. The input signal processing unit is used to receive an RF signal and to output a first signal and a second signal. The input signal processing unit mainly performs power distribution for signals and input impedance matching with the following amplifiers. An input end of the carrier power amplifier is coupled to the input signal processing unit and receives the first signal to generate a first amplified signal. The carrier power amplifier further comprises a first transistor-size adjusting unit that adjusts an equivalent transistor size according to a mode indication signal. An input end of the peaking power amplifier is coupled to the input signal processing unit and receives the second signal to generate a second amplified signal. The peaking power amplifier further comprises a second transistor-size adjusting unit that adjusts an equivalent transistor size according to a mode indication signal. The output signal processing unit receives the first and the second amplified signals, and combines the first and the second amplified signals to output an output signal.

The above input signal processing unit and the output signal processing unit can be referred as an external circuit of the multi-frequency and multi-mode power amplifying circuit, and are mainly responsible for signal processing of the multi-frequency operation. The above input signal processing unit generally can further comprise a power distributor and an input matching network, and the output signal processing unit can further comprise an impedance transformer and an output matching network. The following circuit structures are described by using above example. However, without departing from the spirit of the present invention, any appropriate modifications may also be made on the input signal processing unit and the output signal processing unit in practical use.

Figure 1:
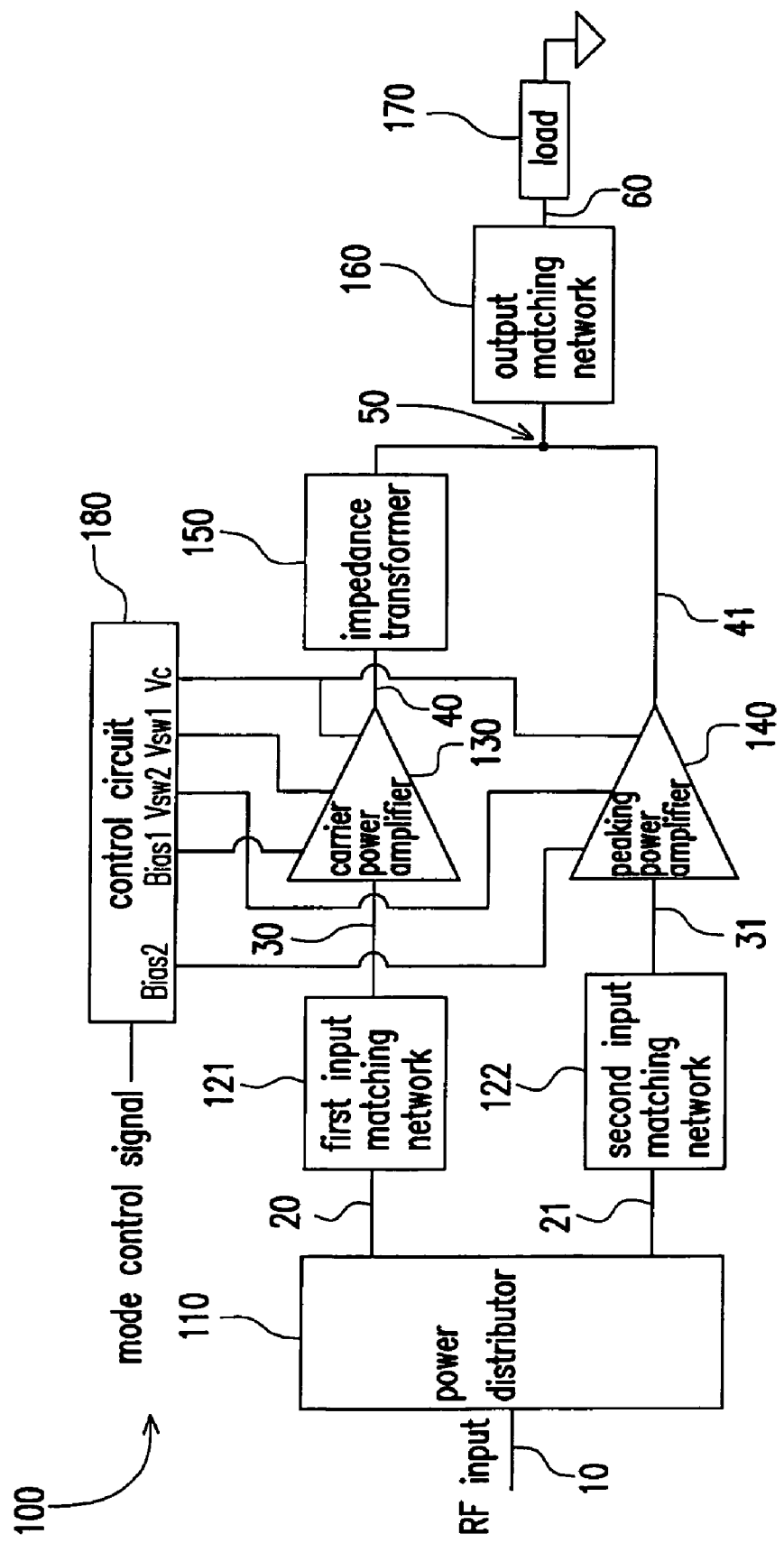

FIG. 1 schematically illustrates a circuit diagram of the multi-frequency and multi-mode power amplifying circuit of the present embodiment. As shown in FIG. 1, the multi-frequency and multi-mode power amplifying circuit 100 comprises a power distributor 110, a first input matching network 121, a second input matching network 122, a bias control circuit 180, a carrier power amplifier 130, a peaking power amplifier 140, an impedance transformer 150, an output matching network 160 and etc. A load 170 can be disposed at the output end 60 if necessary. In addition, the present invention can be applied to a multi-frequency and multi-mode system. For convenient description, the embodiment below is described with a dual-frequency and dual-mode structure.

As shown in FIG. 1, the power distributor 110, for example, is an orthogonal equal power distributor, and can equally distributes the power at the input end 10 to the input ends 20, 21 of the input matching networks 121 and 122. In certain circumstances, the input RF signals is not necessary to equally distribute to the input ends 20 and 21 of the input matching networks 121 and 122. Comparing with the input end 20, the signal received at the input end 21 has about 90° and 270° delays respectively at the low frequency and high frequency. Through the input matching networks 121 and 122, the signals on the input ends 20 and 21 can be respectively transmitted to the carrier power amplifier 130 and the peaking power amplifier 140 using a low loss manner.

Signals are respectively amplified by the carrier power amplifier 130 and the peaking power amplifier 140, and then are respectively output from the output ends 40 and 41 of the amplifiers. After the signal output from the output end 40 of the carrier power amplifier 130 passes through the impedance transformer 150, the signal is added to the signal of the output end 41 at the output end 50 of the impedance transformer 150. During the above process, the impedance transformer 150 provides 90° and 270° phase delays for the signal of the output end 40 respectively at low frequency and high frequency, so as to compensate the phase difference that the signal at the end 21 lags behind the end 20.

After the output signals (primary and secondary signals) of the carrier power amplifier 130 and the peaking power amplifier 140 are added at the end 50, the signals can be transmitted through the output matching network 160 to the load 170 by using a low loss manner.

During the operation, the bias control circuit 180 provides different bias level and different equivalent transistor size for the carrier power amplifier 130 and the peaking power amplifier 140 according to different communication system modes. The operation will be described in detail as follows.

Next, in conjunction with the drawings, the above respective circuits will be further described. The descriptions below use dual-frequency as example. For multi-frequency configuration, the peripheral circuit can be just modified to match the multi-frequency operation condition. That is, only slight modifications on the power distributor 110, the first input matching network 121, the second input matching network 122, the impedance transformer 150 and the output matching network 160 are required.

FIG. 2A to FIG. 2D schematically illustrate circuit examples of the impedance transformer 150 of the present embodiment. Herein only a dual-frequency impedance transformer is used as example. The dual-frequency impedance transformer 150 can provide any equivalent characteristic impedance for any two frequency bands, and respectively generates phase offsets of 90° and 270° to these two frequency bands. In this manner, the impedance Z2 at the output end 40 of the carrier power amplifier 130 is inversely proportional with the impedance value Z1 at the output end 50 of the impedance transformer 150.

Figure 2A:
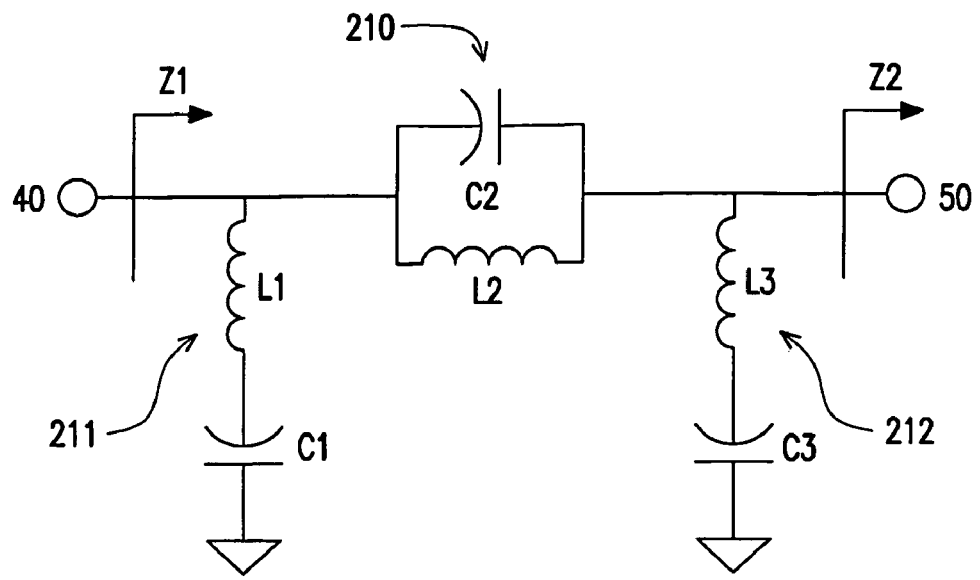
Figure 2B:
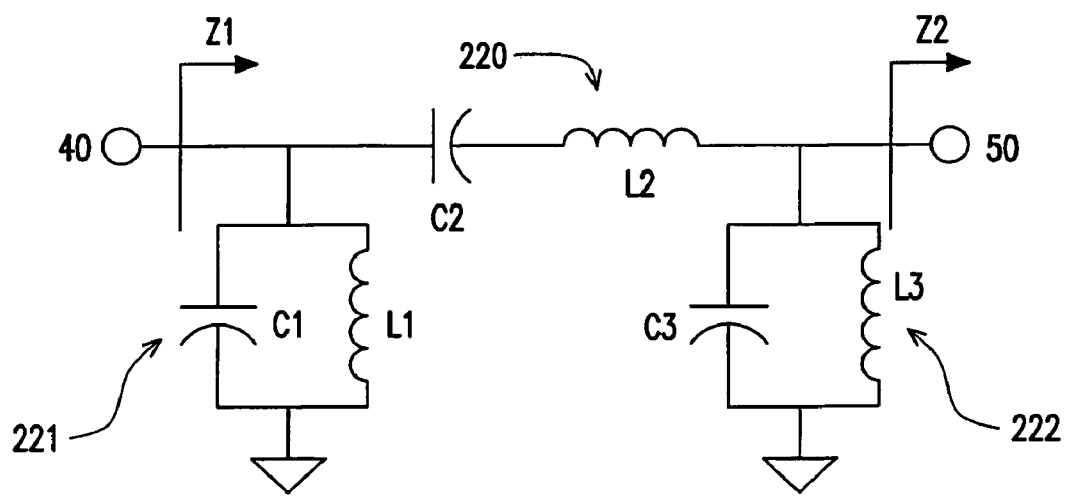

As shown in FIG. 2A or 2B, the impedance transformer comprises a first resonant LC circuit 211 (221), a second resonant LC circuit 210 (220) and a third resonant LC circuit 212 (222), connected in sequence to form a π-model configuration between the input end 40 and the output end 50 of the impedance transformer 150. In the circuit example of FIG. 2A, the first resonant LC circuit 211 comprises series-connected inductor L1 and capacitor C1, the second resonant LC circuit 210 comprises parallel-connected inductor L2 and capacitance C2, the third resonant LC circuit 212 comprises series-connected inductor L3 and capacitor C3. The impedance transformer can be equivalent as a π-model configuration for any two frequencies. Therefore the impedance transformer 150 functions as a dual-frequency impedance transformer. In the circuit example of FIG. 2B, the first resonant LC circuit 221 comprises parallel-connected inductor L1 and capacitor C1, the second resonant LC circuit 220 comprises series-connected inductor L2 and capacitor C2, the third resonant LC circuit 212 comprises parallel-connected inductor L3 and capacitor C3. The impedance transformer can be equivalent as a π-model configuration for any two frequencies. Therefore the impedance transformer 150 functions as a dual-frequency impedance transformer.

Figure 2C:
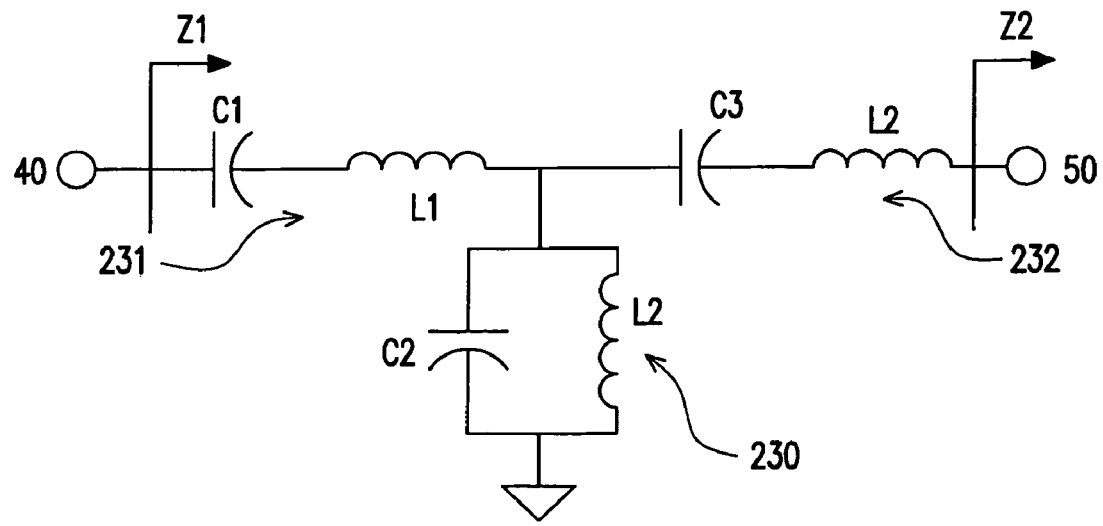
Figure 2D:
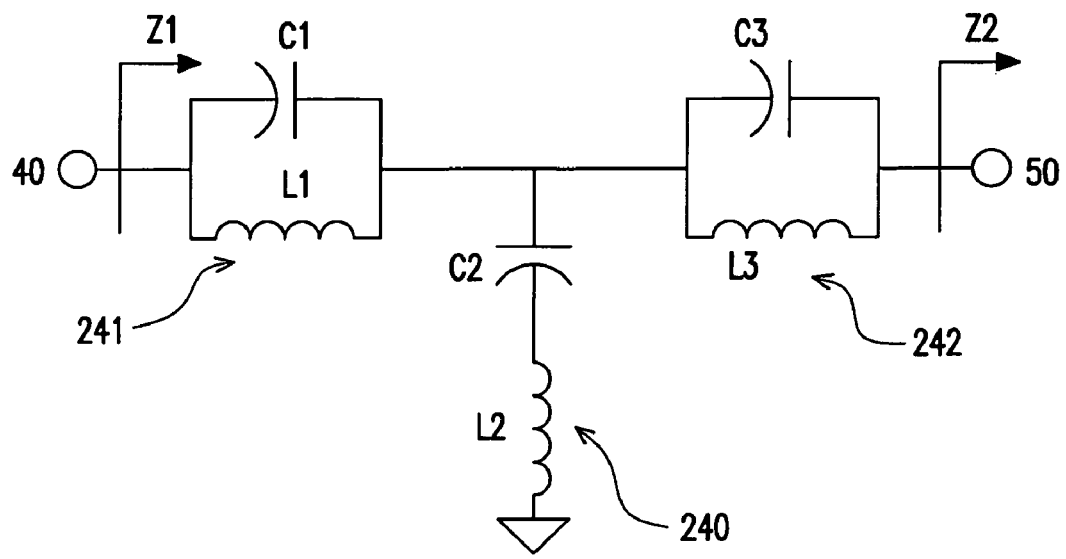

In addition, the impedance transformer 150 can also be constructed by a T-model configuration. As shown in FIGS. 2C and 2D, the impedance transformer 150 comprises a first resonant LC circuit 231 (241), a second resonant LC circuit 230 (240) and a third resonant LC circuit 232 (242) that are connected in sequence into a T-model configuration between the input end 40 and the output end 50 of the impedance transformer 150. In the circuit example of FIG. 2C, the first resonant LC circuit 231 comprises series-connected inductor L1 and capacitor C1, the second resonant LC circuit 230 comprises parallel-connected inductor L2 and capacitor C2, the third resonant LC circuit 232 comprises series-connected inductor L3 and capacitor C3. In the circuit example of FIG. 2D, the first resonant LC circuit 241 comprises parallel-connected inductor L1 and capacitor C1, the second resonant LC circuit 240 comprises series-connected inductor L2 and capacitor C2, the third resonant. LC circuit 242 comprises parallel-connected inductor L3 and capacitor C3. In the circuits of FIG. 2C or 2D, the impedance transformer can provides an equivalent T-model configuration for any two frequencies, and therefore, both function as a dual-frequency λ/4 impedance transformer.

In addition, all above inductors can be implemented on a dielectric substrate in form of microstripe line or stripe line, and can also be implemented with discrete lumped inductor. In addition, the above capacitors can be implemented on a dielectric substrate in form of microstripe line or stripe line, and can also be implemented with discrete lumped capacitor. In addition, the above capacitors can also be implemented on a multi-layered ceramic structure by stacking layers.

Figure 3A:
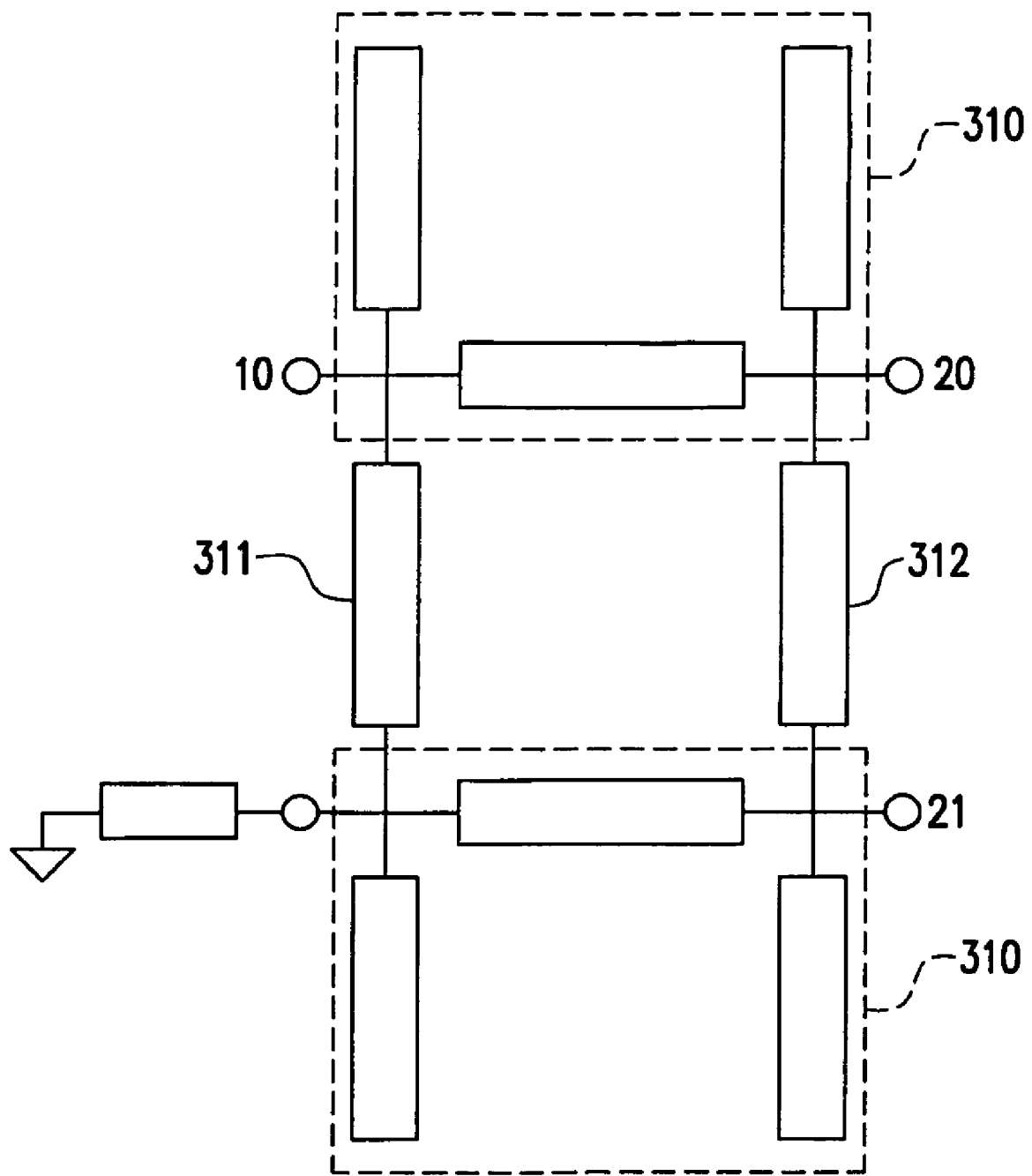

FIG. 3A schematically illustrates a circuit example of a power distributor according to the present embodiment. In the present example, a dual-frequency orthogonal equal power distributor 110 is used as an example for the power distributor 110. Of course, the following embodiment can be slightly modified to be compliant with multi-frequency systems. Also, the equal power distribution can be changed to non-equal power distribution.

As shown in FIG. 3A, the function of the dual-frequency orthogonal equal power distributor 110 is that the power of dual-frequency input signal (RF signal) of the input end 10 is equally distributed to the output ends 20 and 21, and to make the signal of the output end 21 respectively has about 90° and 270° phase delays at low frequency and high frequency comparing with the output end 20. The power distributor 110 at least comprises at least two parallel-arranged dual-frequency quasi-λ/4 transmission lines 310, in which λ is the wavelength of dual-frequency average frequency, and both ends thereof are respectively connected by transmission lines 311 and 312. The lengths of the transmission line 311 and transmission line 312 are close to ¼ wavelength of the dual-frequency average frequency. The individual characteristic impedance thereof is determined based on the system impedance of the dual-frequency orthogonal equal power distributor 110 and the ratio of the two transmission frequencies.

Figure 3B:
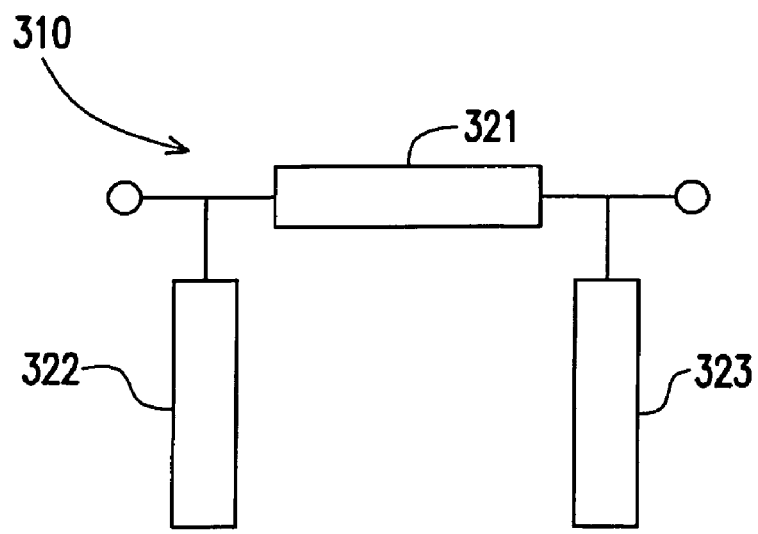
Figure 3C:
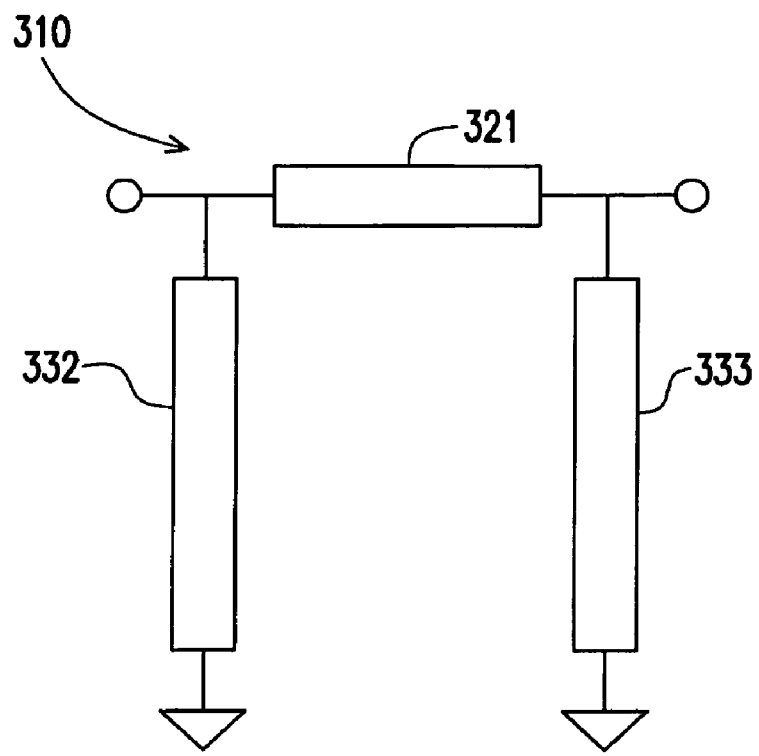

FIGS. 3B and 3C are two examples of the dual-frequency quasi-λ/4 transmission line 310, which can provide any character impedance for any two frequencies, and respectively generate 90° and 270° phase offsets for these two frequencies. As shown in FIG. 3A, the transmission line unit 310 comprises series-connected transmission line 321, two parallel-connected open-circuit transmission lines 322 and 323. The lengths of the transmission lines 321, 322 and 323 are close to ¼ wavelength of the dual-frequency average frequency. The individual characteristic impedance thereof is determined based on the characteristic impedance being equivalent by using the dual-frequency quasi-λ/4 transmission line 310 and the ratio of the two transmission frequencies. The difference between FIG. 3C and FIG. 3B is that the two quasi-¼ wavelength parallel open-circuit transmission lines 322 and 323 are replaced with two quasi-½ wavelength parallel short-circuit transmission lines 332 and 333.

All above transmission lines can be implemented on a dielectric substrate in form of microstripe line or stripe line, or can be implemented on a multi-layered ceramic structure in form of stripe line.

Figure 4A:
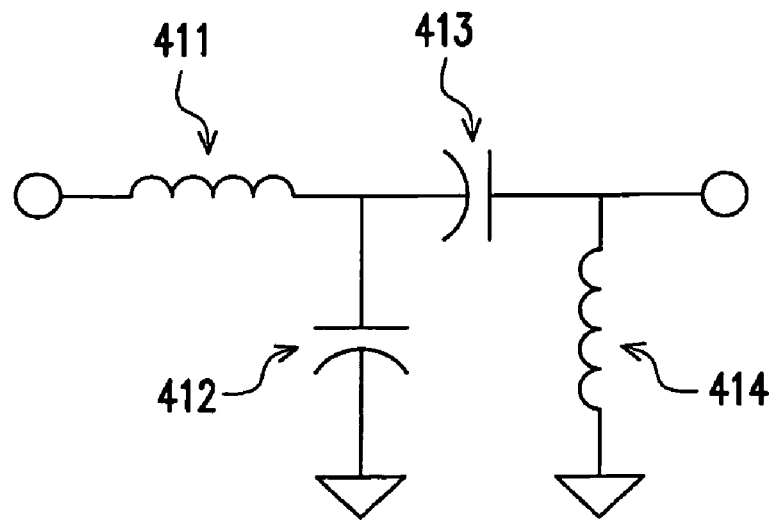
Figure 4B:
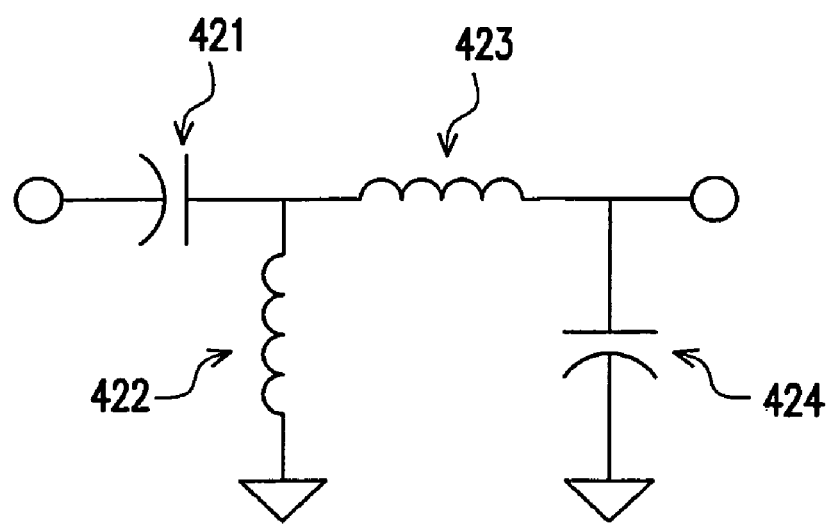

FIGS. 4A and 4B are examples of the impedance matching network of the present embodiment. The impedance matching network in FIGS. 4A and 4B can be applied to the input impedance matching networks 121, 122 and the output impedance matching network 160 of FIG. 1, and for example both are able to provide dual-frequency impedance matching function. For the multi-frequency systems, only slight modifications are needed. The impedance matching network of the examples of FIGS. 4A and 4B comprises series-connected first and second LC circuits. As shown in FIG. 4A, the first LC circuit can comprise an inductor 411 and a capacitor 412, and the second LC circuit can comprise a capacitor 413 and an inductor 414. The inductor 411 is connected to an end of one of the two matching end impedances whichever the impedance is smaller. In FIG. 4B, the first LC circuit can comprise a capacitor 421 and an inductor 422, and the second LC circuit can comprise an inductor 423 and a capacitor 424, in which the capacitor 421 is connected to an end of one of the two matching end impedances whichever the impedance is smaller.

In addition, all above inductors can be implemented on a dielectric substrate in form of microstripe lines or stripe lines, and can also be implemented with discrete lumped inductors. In addition, the above capacitors can be implemented on a dielectric substrate in form of microstripe lines or stripe lines, and can also be implemented with discrete lumped capacitors. In addition, the above capacitors can also be implemented on multi-layered ceramic structure by stacking layers.

Figure 5A:
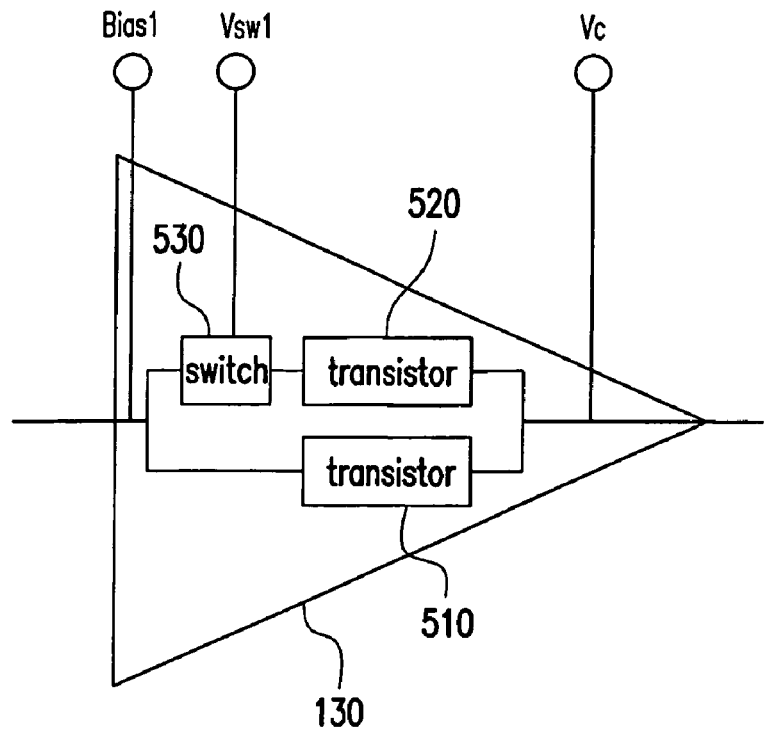
Figure 5B:
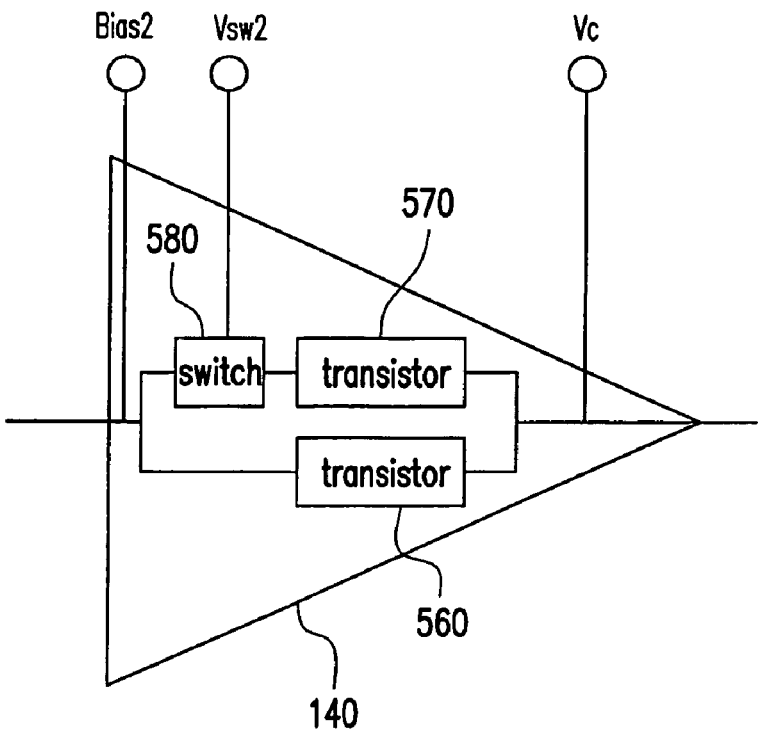
Figure 5C:
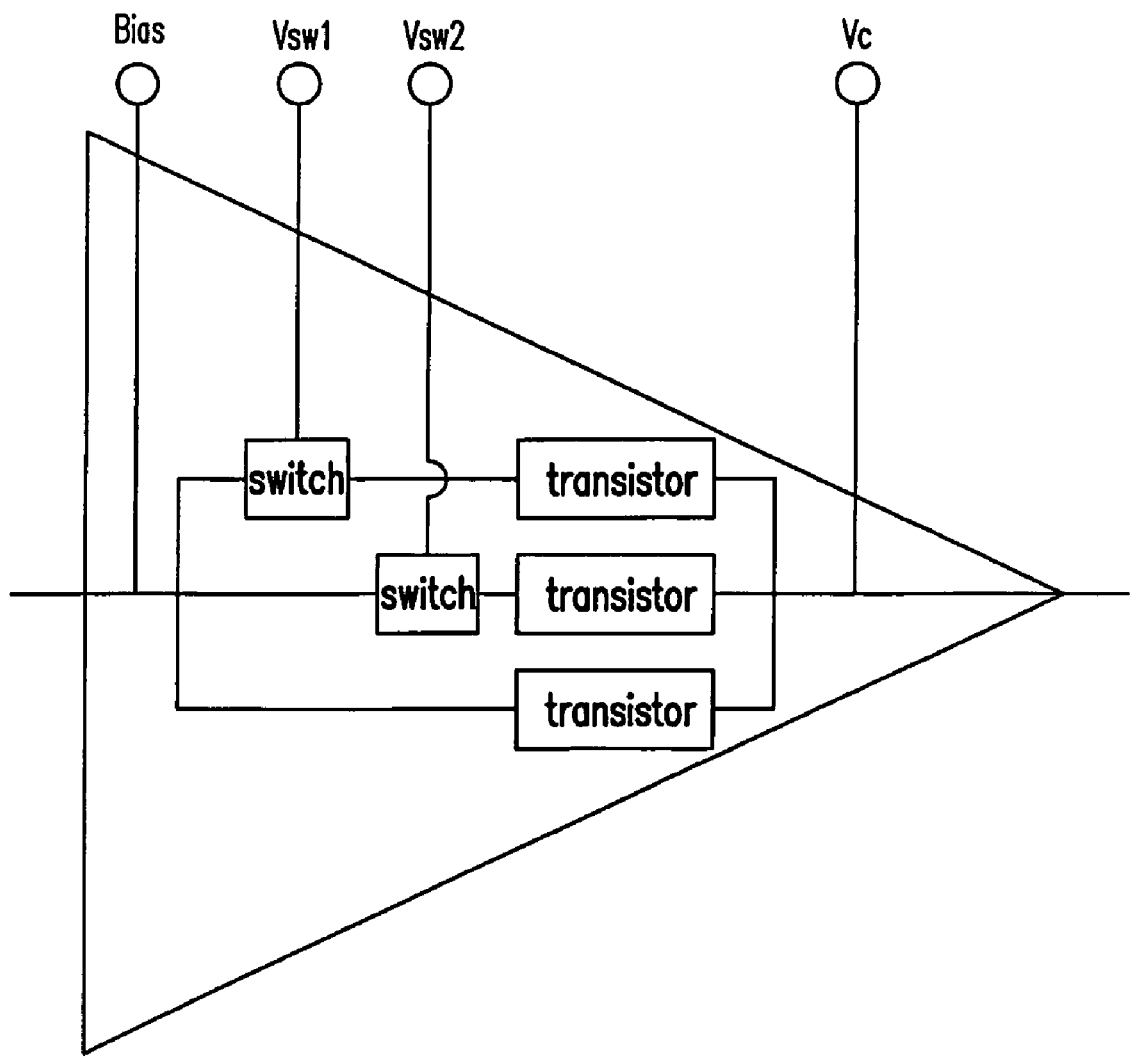

Next, the main part of the present invention, the structures of the carrier power amplifier 130 and the peaking power amplifier 140, is described. FIG. 5A schematically illustrates a circuit structure diagram of the carrier power amplifier 130 of the present embodiment. FIGS. 5A and 5B, 5C only illustrates the most relevant elements of the present embodiment; the other common elements the power amplifier required are omitted.

As shown in FIG. 5A, the carrier power amplifier 130 comprises a transistor 510, a transistor 520 and a switch 530.

The transistor 510, the transistor 520 and the switch 530 can be all or partially on the same chip, or can be respectively discrete elements. Furthermore, according to an external mode indication signal, a bias Bias1 and a switch control signal Vsw1 corresponding to operation frequency and mode can be output from the bias control circuit 180 as shown in FIG. 1, which are respectively provided for the carrier power amplifier 130. The ON state of the transistor 520 can be controlled through a switching mechanism of the switch 530, i.e., the switch control signal Vsw1. In other words, the carrier power amplifier 130 can be operated under single transistor 510, or operated under two transistors 510, 520 according to the operation mode.

A dual-frequency and dual-mode Doherty power amplifier is used as an example to illustrate. When the power amplifier circuit 100 is operated at a smaller power due to different communication mode, the carrier power amplifier 130 only needs a smaller transistor size. At this moment, through the switch control signal Vsw1, the switch 530 is switched to the OFF state, i.e., the open-circuit state. In this way, the transistor 520 is not activated, and the carrier power amplifier 130 is operated only with the transistors 510, and the bias Bias1 and the input power at the input end 30 are only passed the transistor 510. At this time, the equivalent total size of the carrier power amplifier 130 is the size of the transistor 510. Generally the bias Bias1 can be designed to allow the carrier power amplifier 130 to be operated between class A and class B.

In addition, the carrier power amplifier 130 needs a larger transistor size when the power amplifier circuit 100 is operated at a larger power due to communication mode. At this time, through the switch control signal Vsw1, the switch 530 is switched to the ON state, i.e., the short-circuit state. In this way, the carrier power amplifier 130 is operated with the transistor 510 and the transistor 520. At this time, the equivalent total size of the carrier power amplifier 130 is the sum of the sizes of the transistor 510 and the transistor 520. At this time, both the bias Bias1 and the input power on the input end 30 are provided to the transistor 510 and the transistor 520.

FIG. 5B schematically illustrates a circuit structure diagram of the peaking power amplifier of the present embodiment. As shown in FIG. 5B, the peaking power amplifier 140 comprises a transistor 560, a transistor 570 and a switch 580. The transistor 560, the transistor 570 and the switch 580 can be all or partially on the same chip, or can be respectively formed in discrete elements. Furthermore, according to an external mode indication signal, the bias control circuit 180 as shown in FIG. 1 outputs the bias Bias2 and a switch control signal Vsw2, both corresponding operation frequency and mode, and provided to the peaking power amplifier 140 respectively. The ON state of the transistor 570 can be controlled through the switching mechanism of the switch 580, i.e., the switch control signal Vsw2. In other words, the carrier power amplifier 140 can be operated under single transistor 560, or operated under the two transistors 560, 570 according to the operation mode.

When the power amplifier circuit 100 is operated at a smaller power due to different communication mode, the peaking power amplifier 140 only needs a smaller transistor size. At this time, through the switch control signal Vsw2, the switch 580 is switched to the OFF state, i.e., the open-circuit state. In this way, the carrier power amplifier 140 operates only with the transistor 560. At this time, the bias Bias2 and the input power on the input end 31 are only provided to the transistor 560. In addition, the peaking power amplifier 140 needs a larger transistor size when the power amplifier circuit 100 is operated at a larger power due to communication mode.

At this time, the switch 580 is switched to the ON state, i.e., the short-circuit state, according to the switch control signal Vsw2. In this way, the carrier power amplifier 140 is operated only with the transistor 560 and the transistor 570, and the bias Bias2 and the input power on the input end 31 are also provided to the transistor 560 and the transistors 570. In this case, the equivalent total size of the peaking power amplifier 140 is the sum of individual sizes of the transistor 560 and the transistor 570. Generally the bias Bias2 can be designed in a manner that the peaking power amplifier 140 is operated between the class B and the class C.

In the above embodiment, for example, the carrier power amplifier 130 is operated between the class A and class B transistors, and the peaking power amplifier 140 is operated between the class B and class C transistors. However this is only an example. The operation class of the transistors of the carrier power amplifier 130 and the peaking power amplifier 140 can be changed based on practical requirements.

The above bias Bias1 and Bias2 can respectively control the bias modes of the carrier power amplifier 130 and the peaking power amplifier 140, so as to adjust the efficiency and linearity of the carrier power amplifier 130 and the peaking power amplifier 140.

In summary, by disposing the switch 530 and the switch 580, the equivalent transistor sizes in the carrier power amplifier 130 and the peaking power amplifier 140 can be effectively controlled respectively, and the power output capability of the carrier power amplifier 130 and the peaking power amplifier 140 is also controlled. In other words, when the power amplifier 100 is required to be operated with a smaller power due to different communication mode, the transistors 520, 570 can be disabled through the switch control signals Vsw1, Vsw2, so that the carrier power amplifier 130 and the peaking power amplifier 140 are respectively operated with a smaller equivalent transistor size. On the contrary, when the power amplifier 100 is required to be operated with a larger power due to different communication mode, the transistors 520, 570 can be enabled through the switch control signals Vsw1, Vsw2, so that the carrier power amplifier 130 and the peaking power amplifier 140 are respectively operated with a larger equivalent transistor size. In addition, it can also only enable the operation of the carrier power amplifier 130, but disable the operation of the peaking power amplifier 140 through the bias control.

Therefore, by using the above power amplifier structure, adapting to communication system with different frequencies and adjusting the required point of the average-to-peak output power can be effectively and assuredly achieved.

FIG. 5C schematically illustrates a variation example of an application to a multi-mode case. The power amplifiers shown in FIG. 5A and FIG. 5B are to describe the circuit structure under dual-mode. When the power amplifier of the present embodiment is used in the multi-mode case, corresponding modifications can be made. FIG. 5C schematically illustrates a three-mode variation, and for more than three modes, modifications can be made accordingly. Under the three-mode case, the power transistor can be operated by disposing three transistors. Two of the three transistors are respectively connected with a switch circuit in a serial manner. The respective switch circuit can be controlled by the respective switch control signals Vsw1, Vsw2. For example, the power transistor can be controlled to operate under only one transistor, or under two or three transistors, so that the power transistor can be operated under three modes.

Figure 6:
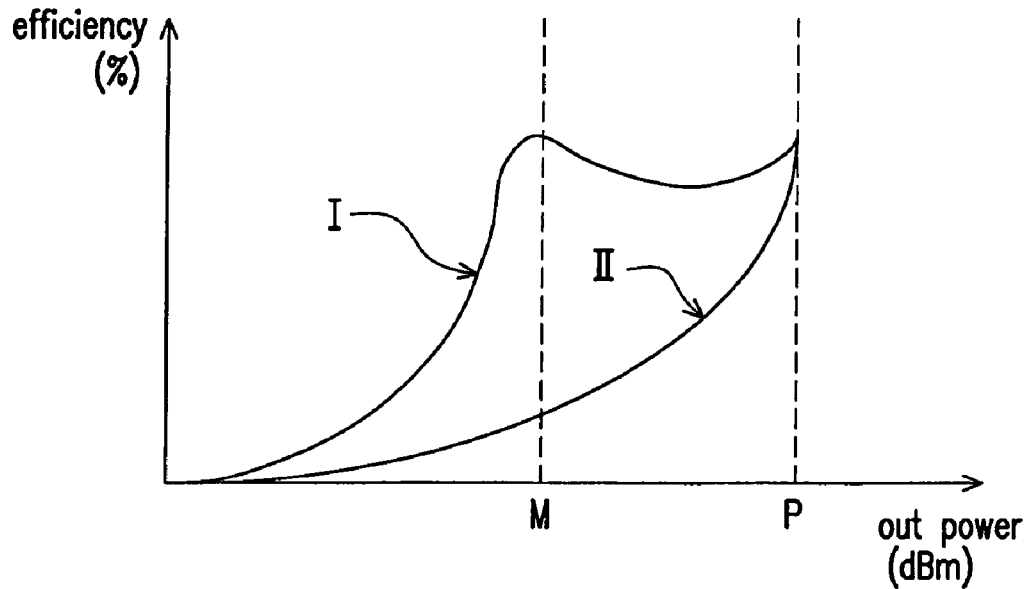
FIG. 6 shows the comparison of operation effectiveness between a traditional single-frequency and single-mode Doherty power amplifier and a traditional linear amplifier.
Figure 7:
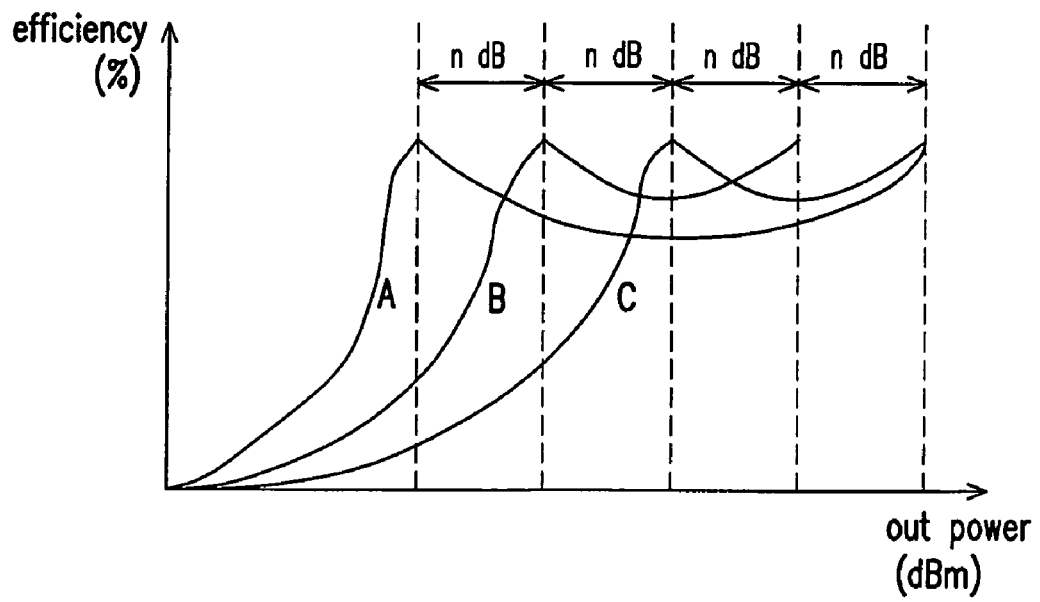
FIG. 7 shows the behavior on operation effectiveness of the dual-frequency and dual-mode Doherty power amplifier of the present invention.

Next, FIG. 6 and FIG. 7 are used to describe the difference between the present invention and prior arts. FIG. 6 shows the comparison of operation efficiency between the known single-frequency, single-mode Doherty power amplifier and the traditional linear amplifier. The traditional linear amplifier has higher operation efficiency only at the P point (peak output power) near the saturation region. On the contrary, for the Doherty power amplifier, the output power maintains at high level both at M point and P point. If the M point is designed to be near the average output power region (the operation region of power amplifier in most time), then the actual operation efficiency of the power amplifier will be significantly increased.

Doherty power amplifier can have higher efficiency. The main reason is that when the output power is lower than the M point, i.e., located at the low power region, only the carrier power amplifier 130 (referring to FIG. 1) is activated, and therefore the power consumption is lower. At this time, the output load value of the carrier power amplifier 130 at the end 40 is twice the value of the best output load, and therefore the carrier power amplifier 130 is able to enter the saturation region early, and therefore high operation efficiency is achieved. When the output power requires a higher level than the level at the M point, the peaking power amplifier 140 is activated to provide an additional amplifying power to be combined with the output power of the carrier power amplifier 130 at the end 50. At this time, the output load of the carrier power amplifier 130 at the end 40 becomes smaller due to the activation of the peaking power amplifier 140, and thus a larger output signal can be provided. When the total output power reaches the P point, both the carrier power amplifier 130 and the peaking power amplifier 140 have the best output load value at the end 40 and the end 41, and the efficiency between the M point and the P point also maintains at a high level since the peaking power amplifier 140 provides the additional power.

FIG. 7 is an embodiment when the multi-frequency and multi-mode power amplifier of the present invention (using the dual-frequency and dual-mode Doherty power amplifier as an example) is in operation efficiency behavior. During the design stage, the sizes of the transistors 510, 520, 560, 570 are properly chosen, and the locations of the M point and the P point of any communication system can be arbitrarily controlled in coordination with switching of the switch 530 and 580 as well as controlling the levels of the bias Bias1 and the bias Bias2.

When the first communication system needs the lower M point level in comparison with the second communications system, the switch 530 is turned off, so that the carrier power amplifier 130 only have the equivalent size of the transistor 510. At this time, the bias Bias1 and the input power at the end 30 is only provided to the transistor 510. By controlling the bias Bias1, the carrier power amplifier 130 is operated between the class A and the class B, and the bias Bias2 is responsible for turning off the peaking power amplifier 140 before the output power is higher than the M point. If the higher M point level is needed, then the switch 530 is turned on, so that the carrier power amplifier 130 has an equivalent total size of the transistors 510 and 520. At this time, the bias Bias1 and the input power at the end 30 are provided to the transistors 510 and 520. The carrier power amplifier 130 is operated between the class A and the class B by controlling the bias Bias1, and the Bias2 is responsible for turning off the peaking power amplifier 140 before the output power is higher than the M point.

On the other hand, when the first communication system needs the lower P point level in comparison with the second communications system, the switch 580 is turned off, so that the peaking power amplifier 140 only has the equivalent size of the transistor 560. At this time, the bias Bias2 and the input power at the end 31 are only provided to the transistor 560. By controlling the bias Bias2, the peaking power amplifier 140 is operated between the class B and the class C, and the bias Bias1 continues to activate the carrier power amplifier 130 after the output power is higher than the M point. If a higher P point level is needed, the switch 580 is turned on, so that the peaking power amplifier 140 has the equivalent total size of the transistors 560 and 570. At this time, the bias Bias2 and the input power at the end 31 are provided to the transistors 560 and 570. By controlling the bias Bias2, the peaking power amplifier 140 is operated between the class B and the class C, and the bias Bias1 continues to activate the carrier power amplifier 130 after the output power is higher than the M point.

According to the above operation mechanism, for example, in the case of n=3 (i.e., the gap between any two adjacent curves A, B, C of FIG. 7 is 3 dB), when the two operation modes are required to have behaviors of curves A and B, the size ratio of the transistors 510, 520, 560 and 570 for example is about 2:1:3:3. When the two operation modes are required to have behaviors of curves B and C, the size ratio of the transistors 510, 520, 560 and 570 is about 1:1:1:1.

In summary, through the power amplifier circuit of the present invention, the carrier and peaking power amplifiers themselves can have function of adjusting the equivalent transistor size. Therefore, the power amplifier can be effectively applied to the multi-mode system.

In addition, through appropriate modifications on external circuit, for example the multi-frequency and multi-mode adjustment to the power distributor, output/input impedance matching network, impedance transformer and etc, the power amplifier can be applied to multi-frequency systems.

Therefore, the power amplifying circuit provided by the present invention can be effectively applied to multi-frequency and multi-mode systems. In addition, through the multi-frequency and multi-mode power amplifier of the present invention, the system efficiency can be further increased, and thus the electricity consumption can also be relatively decreased.

The power amplifying circuit of the present invention can be applied to any system with a plurality of operating frequencies or modes, for example in WiFi (WLAN)/WiMAX systems, GSM/3G(4G) systems and etc.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-frequency and multi-mode Doherty-type power amplifying circuit, comprising
    an input-signal processing unit, used to receive a radio frequency (RF) signal and to output a first signal and a second signal with equal or unequal powers;
    a first amplifier, having an input end coupled to the input-signal processing unit, and receiving the first signal to generate a first amplified signal, wherein the first amplifier further comprises a first transistor size adjusting unit that adjusts an equivalent transistor size according to a mode indication signal;
    second amplifier, having an input end coupled to the input-signal processing unit, and receiving the second signal to generate a second amplified signal, wherein the second amplifier further comprises a second transistor size adjusting unit that adjusts an equivalent transistor size according to the mode indication signal; and an output-signal processing unit, receiving the first and the second amplified signals, delaying a phase of the first amplified signal by 90 degrees and combining the phase-delayed first amplified signal and the second amplified signals, and then outputting an output signal.

2. The multi-frequency and multi-mode Doherty-type power amplifying circuit of claim 1, wherein the first amplifier further comprises n transistors parallel connected between the input end and the output end; and (n-1) switch elements, respectively coupled between the (n-1) transistors and the input end, where n is a nature number;

the second amplifier further comprises n transistors parallel connected between the input end and the output end; and (n-1) switch elements respectively coupled between the (n-1) transistors and the input end, wherein the switch of the respective (n-1) switch elements of the first and the second amplifiers is controlled according to the mode indication signal.

3. The multi-frequency and multi-mode Doherty-type power amplifying circuit of claim 2, further comprising a bias control circuit, coupled to the first and the second amplifiers, receiving the mode indication signal to generate a first and second bias signals correspondingly that are respectively provided for the first and the second amplifiers, and to generate (n-1) switch control signals, respectively provided for the (n-1) switch elements.

4. The multi-frequency and multi-mode Doherty-type power amplifying circuit of claim 2, wherein the transistors and the switch elements are integrated in one chip, or formed with discrete elements.

5. The multi-frequency and multi-mode Doherty-type power amplifying circuit of claim 2, wherein the first and the second amplifiers are respectively a carrier power amplifier and a peaking power amplifier and form a Doherty power amplifier.

6. The multi-frequency and multi-mode Doherty-type power amplifying circuit of claim 1, wherein the input-signal processing unit further comprises:

a power distributor, used to receive the RF signal and to output two signals with the same or different power; and an input matching network, coupled to the output end of the power distributor, performing an impedance matching between the input-signal processing unit and the first and the second amplifiers.

7. The multi-frequency and multi-mode Doherty-type power amplifying circuit of claim 6, wherein the input matching network further comprises a first and a second input matching networks, performing an impedance matching for the first and the second amplifiers respectively, so as to respectively output the first and the second signals.

8. The multi-frequency and multi-mode Doherty-type power amplifying circuit of claim 7, wherein the output-signal processing unit further comprises:

an impedance transformer, coupled to the output end of the first amplifier, and transforming an impedance of the second amplifier; and an output matching network, coupled to the output ends of the second amplifier and the impedance transformer, and outputting the output signal.

9. The multi-frequency and multi-mode Doherty-type power amplifying circuit of claim 8, wherein the impedance transformer further comprises a first resonant LC circuit, a second resonant LC circuit and a third resonant LC circuit that are sequentially connected as a π-model configuration between an input end and an output end of the impedance transformer.

10. The multi-frequency and multi-mode Doherty-type power amplifying circuit of claim 8, wherein the impedance transformer further comprises a first resonant LC circuit, a second resonant LC circuit and a third resonant LC circuit that are sequentially connected as a T-model configuration between an input end and an output end of the impedance transformer.

11. The multi-frequency and multi-mode Doherty-type power amplifying circuit of claim 8, wherein the impedance transformer is an impedance transformer that provides about 90° and 270° phase delays respectively at low frequency and high frequency.

12. The multi-frequency and multi-mode Doherty-type power amplifying circuit of claim 8, wherein the first, the second input matching network or the output matching network further comprises a first LC circuit and a second LC circuit that are series connected between an input end and an output end of the first, the second input matching network or the output matching network.

13. The multi-frequency and multi-mode Doherty-type power amplifying circuit of claim 6, wherein the power distributor is an orthogonal equal power distributor.

14. The multi-frequency and multi-mode Doherty-type power amplifying circuit of claim 13, wherein the orthogonal equal power distributor further comprises:

an input end, receiving the RF signal;

a first and a second output ends, used to output two signals with equal power;

a first transmission line unit, coupled between the input end and the first output end; and a second transmission line unit, parallel disposed with the first transmission line unit via at least a transmission line.

15. The multi-frequency and multi-mode Doherty-type power amplifying circuit of claim 14, wherein the first transmission line unit comprises:

a first transmission line having one end coupled to the input end of the orthogonal equal power distributor;

a second transmission line, coupled between the input end and the first output end; and a third transmission line having one end coupled to the first output end;

wherein another ends of the first and the third transmission lines are connected as open-circuit or short-circuit state.

16. The multi-frequency and multi-mode Doherty-type power amplifying circuit of claim 14, wherein the second transmission line unit comprises:

a first transmission line having one end coupled to a load;

a second transmission line coupled between the load and the second output end; and a third transmission line having one end coupled to the second output end.

* * * * *